US012772510B2

(12) United States Patent
Naylor et al.

(10) Patent No.: US 12,772,510 B2
(45) Date of Patent: Oct. 20, 2026

(54) SELF-ASSEMBLED MONOLAYER ON A DIELECTRIC FOR TRANSITION METAL DICHALCOGENIDE GROWTH FOR STACKED 2D CHANNELS

(71) Applicant: Intel Corporation, Santa Clara, CA (US)

(72) Inventors: Carl H. Naylor, Portland, OR (US); Kirby Maxey, Hillsboro, OR (US); Kevin P. O'Brien, Portland, OR (US); Chelsey Dorow, Portland, OR (US); Sudarat Lee, Hillsboro, OR (US); Ashish Verma Penumatcha, Beaverton, OR (US); Uygar E. Avci, Portland, OR (US); Matthew V. Metz, Portland, OR (US); Scott B. Clendenning, Portland, OR (US); Jiun-Ruey Chen, Hillsboro, OR (US); Chia-Ching Lin, Portland, OR (US); Carly Rogan, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 268 days.

(21) Appl. No.: 17/850,078

(22) Filed: Jun. 27, 2022

(65) Prior Publication Data

US 2023/0420510 A1 Dec. 28, 2023

(51) Int. Cl.
*H10D 30/47* (2025.01)
*H10D 30/67* (2025.01)
(Continued)

(52) U.S. Cl.
CPC .......... *H10D 62/121* (2025.01); *H10D 30/47* (2025.01); *H10D 30/6735* (2025.01);
(Continued)

(58) Field of Classification Search
CPC ......... H01L 21/02485; H01L 21/02499; H01L 21/02568; H10D 30/47; H10D 30/6757;
(Continued)

(56) References Cited

U.S. PATENT DOCUMENTS 10,388,732 B1 * 8/2019 Frougier .............. H10D 62/121
2016/0141427 A1 * 5/2016 Chen .................... H10D 30/675 257/349
(Continued)

*Primary Examiner* — David Vu
*Assistant Examiner* — Brandon C Fox
(74) *Attorney, Agent, or Firm* — Schwabe, Williamson & Wyatt, P.C.

(57) ABSTRACT

Embodiments described herein may be related to apparatuses, processes, and techniques directed to creating a transistor structure by selectively growing a 2D TMD directly in a stacked channel configuration, such as a stacked nanowire or nanoribbon formation. In embodiments, this TMD growth may occur for all of the nanowires or nanoribbons in the transistor structure in one stage. Placement of a SAM on a plurality of dielectric layers within the transistor structure stack facilitates channel deposition and channel geometry in the stacked channel configuration. Other embodiments may be described and/or claimed.

23 Claims, 10 Drawing Sheets

(51) Int. Cl.
*H10D 62/10* (2025.01)
*H10D 62/84* (2025.01)
*H10P 14/20* (2026.01)

(52) U.S. Cl.
CPC ....... *H10D 30/675* (2025.01); *H10D 30/6757* (2025.01); *H10D 62/84* (2025.01); *H10P 14/3236* (2026.01); *H10P 14/3246* (2026.01); *H10P 14/3436* (2026.01)

(58) Field of Classification Search
CPC .. H10D 62/84; H10D 30/675; H10D 30/6735; H10P 14/3236; H10P 14/3246; H10P 14/3436
See application file for complete search history.

(56) References Cited

U.S. PATENT DOCUMENTS

| | | | | |
|---|---|---|---|---|
| 2022/0102495 | A1* | 3/2022 | Maxey | H10D 62/151 |
| 2022/0238721 | A1* | 7/2022 | Nguyen | H10D 30/47 |
| 2023/0062389 | A1* | 3/2023 | Shen | H10D 30/6735 |
| 2023/0420514 | A1* | 12/2023 | Dorow | H10D 30/47 |
| 2024/0021676 | A1* | 1/2024 | Kim | H10D 62/121 |
| 2025/0072058 | A1* | 2/2025 | Wang | H10D 30/017 |
| 2025/0113573 | A1* | 4/2025 | Vyatskikh | H10D 30/024 |

* cited by examiner

SELF-ASSEMBLED MONOLAYER ON A DIELECTRIC FOR TRANSITION METAL DICHALCOGENIDE GROWTH FOR STACKED 2D CHANNELS

FIELD

Embodiments of the present disclosure generally relate to the field of semiconductor packaging, and in particular to transistor structures with stacked 2D channels.

BACKGROUND

Continued growth in virtual machines, cloud computing, and portable devices will continue to increase the demand for high density transistors within chips and packages.

DETAILED DESCRIPTION

Figure 1:
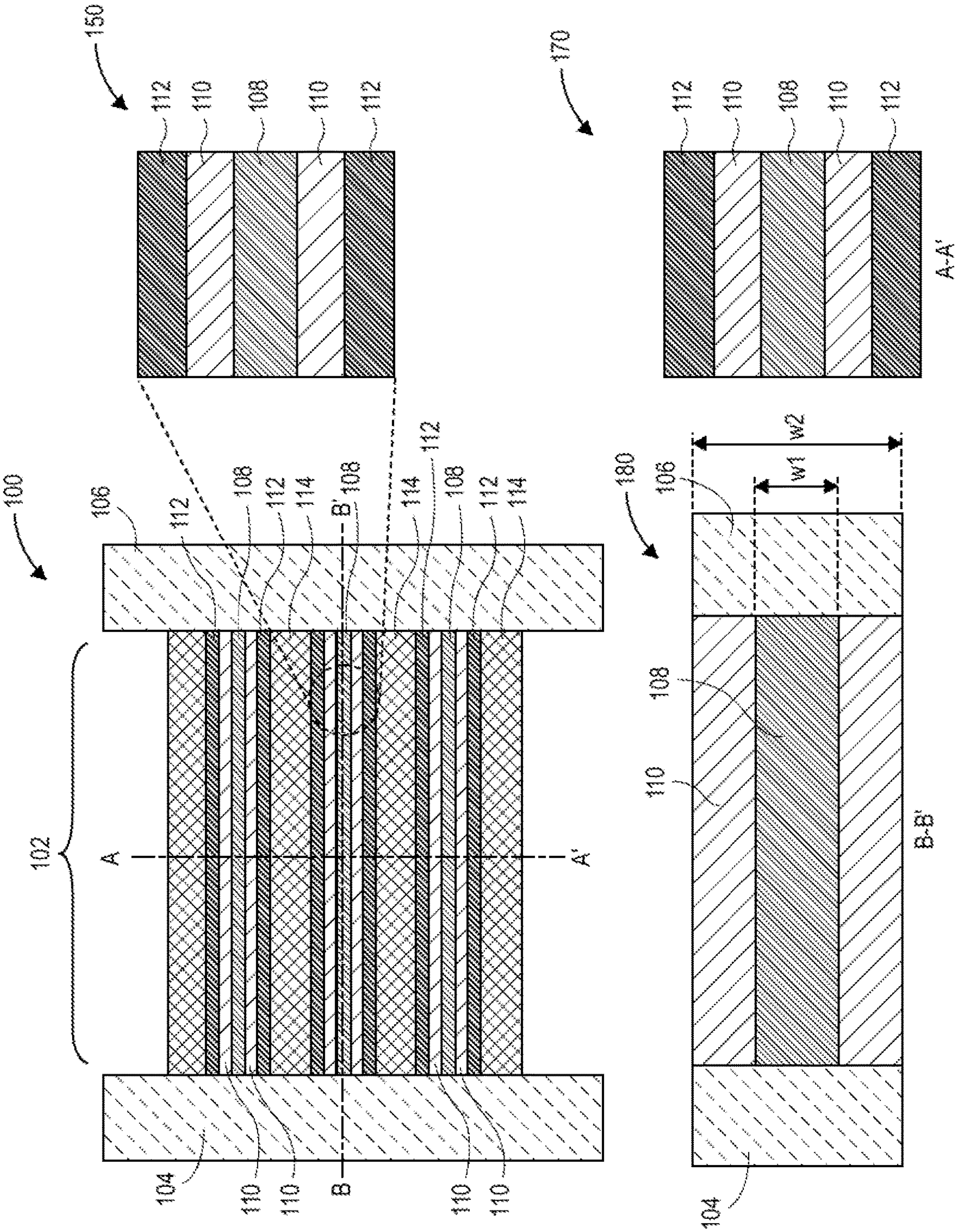
FIG. 1 illustrates a cross-section side view of a transistor structure with stacked gate structures and stacked 2D transition metal dichalcogenide (TMD) layers, a cross-section top-down view of a surface of a dielectric layer, and a cross section end view of the upper and lower dielectric layers, in accordance with various embodiments.

Embodiments described herein may be related to apparatuses, processes, systems, and techniques directed to creating a transistor structure by selectively growing a 2D TMD directly in a stacked channel configuration, such as a stacked nanowire or stacked nanoribbon formation. In embodiments, this TMD growth may occur for all of the nanowires or nanoribbons in the transistor structure in one stage. In embodiments, placement of an SAM on a plurality of dielectric layers within the transistor structure stack facilitates various embodiments of creating different nanowire or nanoribbon geometries within the stacked channel configuration.

SAM material may be deposited to define areas of channel growth on multiple dielectric layers. For example, in embodiments, SAM material may be deposited to inhibit growth of TMD on areas of the dielectric layers by preventing the synthesis of the TMD materials in the covered areas. The placement of the SAM material on the dielectric layers may be used to define a geometry of resulting nanowire or nanoribbon, for example one with a very narrow width. A growth of the TMD will then begin on the dielectric where the SAM material is not present. SAM material may be used to enable prefill in features with high aspect ratios by selectively depositing metal layers at the bottom of the vias, which essentially reduces the aspect ratio for subsequent gap fill. Specific SAM material may be chosen to passivate a dielectric that includes silicon dioxide ($SiO_2$) or a high-k dielectric with a dielectric constant greater than $SiO_2$, such as hafnium oxide ($HfO_2$). This results in a densely packed monolayer of organic thin film on top of the dielectric layer or substrate.

In embodiments, after the SAM material is deposited, a treatment of the dielectric surfaces by oxygen ($O_2$) or by oxygen plasma will burn off the deposited SAM material, and will also convert dielectric regions that were not covered by the SAM material to an active TMD growth site. When the TMD is subsequently grown, it will grow preferentially at these active growth sites.

In other embodiments, SAM material may be deposited along a portion of the surface of the dielectric layers, and then a seed, such as a tungsten oxide ($WO_x$) or a molybdenum oxide ($MoO_x$), may be placed within a cavity in the deposited SAM material. In embodiments, this cavity may be used to place various amounts of initial seed on the dielectric layers. The SAM material may then subsequently be removed, and a growth promoter placed on the dielectric layers next to the seed. In embodiments, exposure to a hydride gas may then be used to cause 2D TMD growth of the nanowires or nanoribbons. This embodiment may be preferred for high quality growth of nanowires or nanoribbons instead of using metal organics gases. These embodiments remove the need for wet etching an original metal film into smaller seeds to achieve the direct stack of 2D nanoribbons or nanowires using legacy processes.

In legacy implementations, transistor structures that include a stack of channels, including a stack of nanowires or nanoribbons, are created by using multiple growth steps. For example, repeatedly depositing a gate metal, depositing a dielectric, and growing a channel. In addition, legacy implementations may require patterning MoOx or WOx seeds, selecting a correct thickness, and etching the seed into a shape and region of interest is not needed. As a result, the multiple stages of this legacy process, which can cause multiple issues, may be avoided using embodiments described herein.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 illustrates a cross-section side view of a transistor structure with stacked gate structures and stacked 2D TMD layers, a cross-section top-down view of a surface of a dielectric layer, and a cross section end view of the upper and lower dielectric layers, in accordance with various embodiments. Transistor structure 100 shows a cross section side view that includes a stacked gate structure 102 with a source 104 at a first edge of the stacked gate structure 102 and a drain 106 at a second edge of the stacked gate structure opposite the first edge.

The gate structure 102 includes a plurality of 2D channels 108 that are surrounded by a plurality of dielectric layers 110. In embodiments, the 2D channels may include TMD, and may be referred to as nanowires or nanoribbons. In embodiments, a plurality of metal layers 112 may be adjacent to the plurality dielectric layers 110. In embodiments, the metal layers 112 may be referred to as gate metals. A dielectric 114 may be adjacent to the metal layers 112.

Diagram 150 illustrates an enlarged area of the gate structure 102 cross section, and shows the metal layers 112 dielectric layers 110 and a 2D channel layer 108. Diagram 170 illustrates an enlarged cross section side view along A-A' of metal layers 112 dielectric layers 110 and a 2D channel layer 108. Diagram 180 is a top-down cross-section view along B-B' between metal layers 112, that shows a 2D channel layer 108 with a width w1 on a dielectric layer 110 that has width w2.

Figure 2:
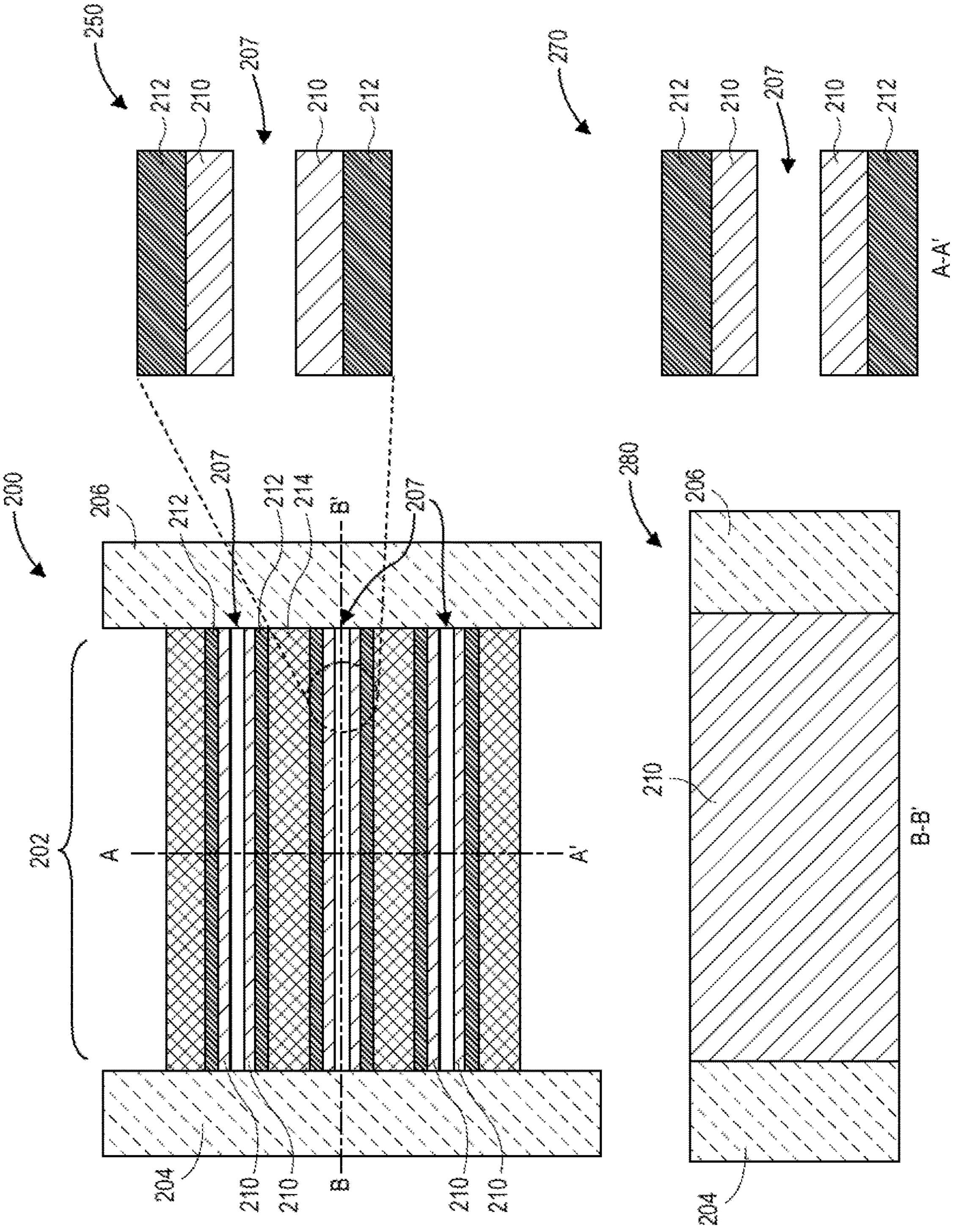
FIG. 2 illustrates a cross-section side view of a transistor structure with stacked gate structures, a cross-section top-down view of a surface of a dielectric layer, and a cross section end view of the upper and lower dielectric layer, in accordance with various embodiments.

FIG. 2 illustrates a cross-section side view of a transistor structure with stacked gate structures, a cross-section top-down view of a surface of a dielectric layer, and a cross section end view of the upper and lower dielectric layer, in accordance with various embodiments. Transistor structure 200, which may be similar to transistor structure 100 of FIG. 1, shows a cross section side view that includes a stacked gate structure 202 with a source 204 at a first edge of the stacked gate structure 202 and a drain 206 at a second edge of the stacked gate structure opposite the first edge. These may be similar to stacked gate structure 102, source 104, and drain 106 of FIG. 1.

The gate structure 202 includes a plurality of openings 207 between a plurality of dielectric layers 210. In embodiments, a plurality of metal layers 212 may be adjacent to the plurality dielectric layers 210. A dielectric 214 may be adjacent to the metal layers 212. These may be similar to metal layers 112, dielectric layers 110, and dielectric 114 of FIG. 1.

Diagram 250 illustrates an enlarged area of the gate structure 202 cross section, and shows the metal layers 212, dielectric layers 210 and an opening 207. Diagram 270 illustrates an enlarged cross section side view along A-A' of metal layers 212, dielectric layers 210, and opening 207. Diagram 280 is a top-down cross-section view along B-B' between metal layers 112, that shows a dielectric layer 210 with no material deposited on it.

Figure 3A:
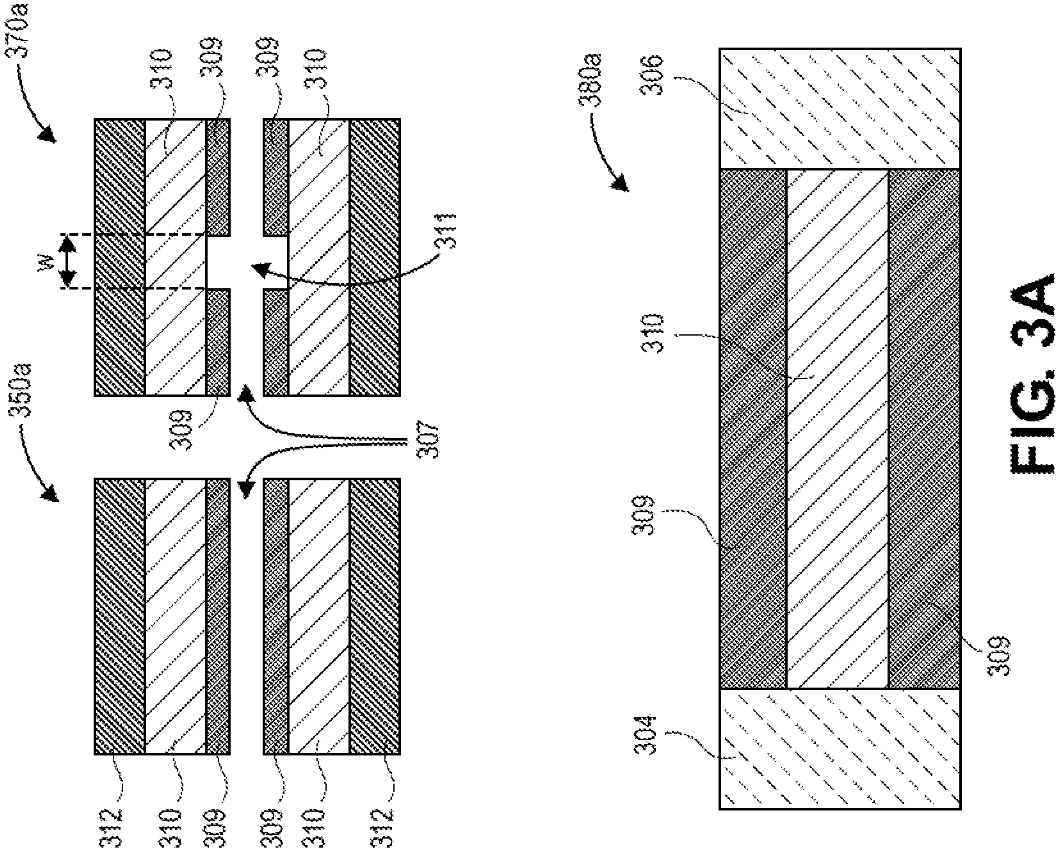
FIGS. 3A-3C illustrate stages in a manufacturing process for creating a transistor structure with stacked gate structures and stacked 2D TMD layers by protecting areas of a dielectric with self-assembled monolayer (SAM) material, and performing oxygen plasma treatment on unprotected areas of the dielectric to cause preferential TMD growth, in accordance with various embodiments.
Figure 3B:
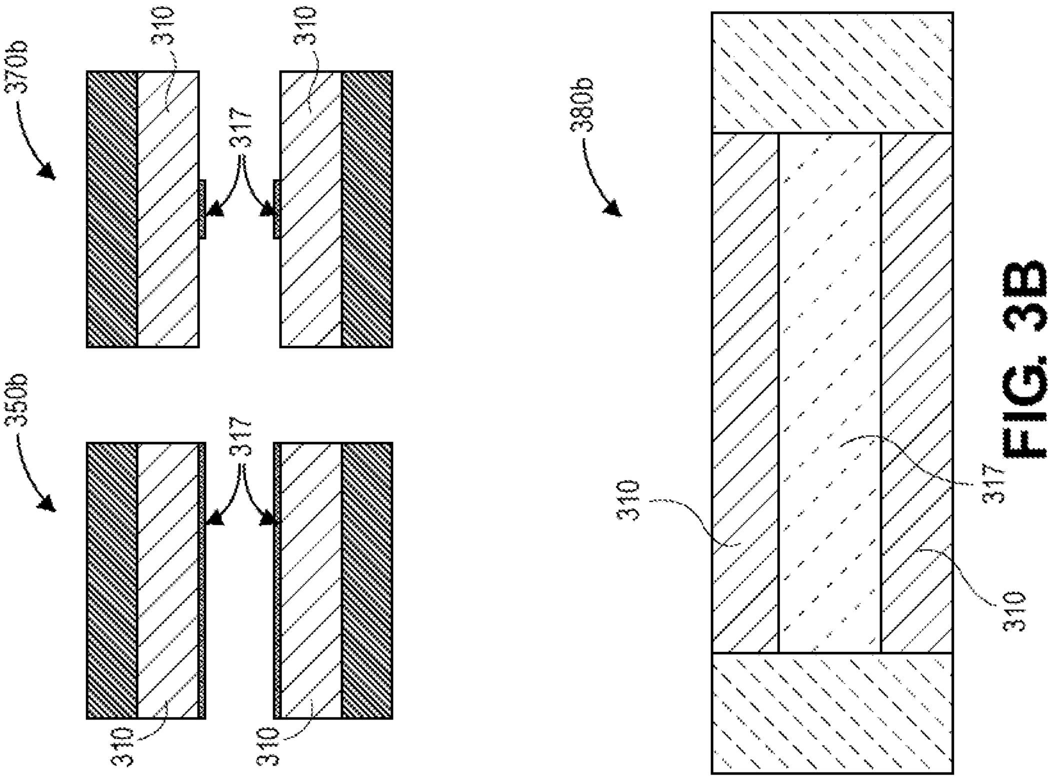
Figure 3C:
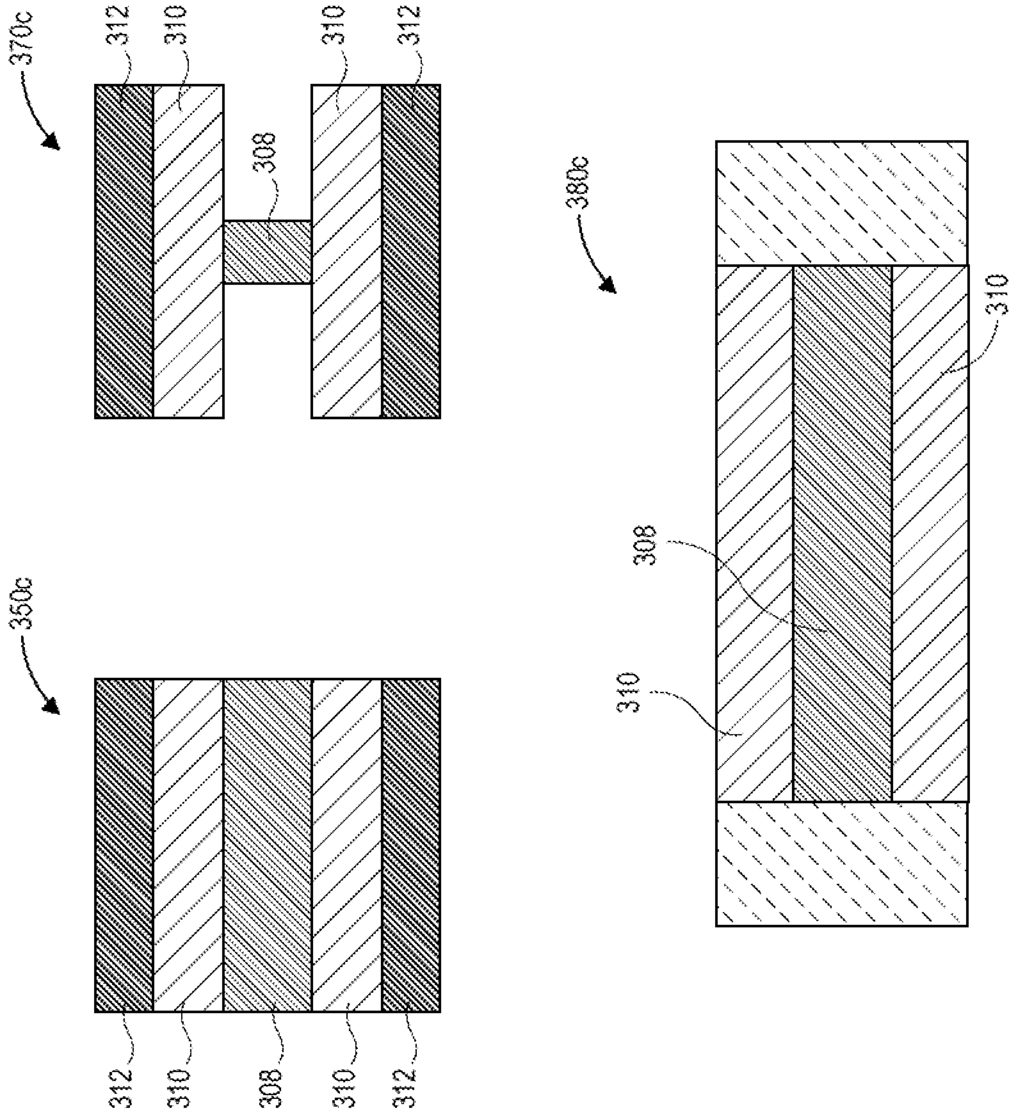

FIGS. 3A-3C illustrate stages in a manufacturing process for creating a transistor structure with stacked gate structures and stacked 2D TMD layers by protecting areas of a dielectric with SAM, and performing oxygen plasma treatment on unprotected areas of the dielectric to cause preferential TMD growth, in accordance with various embodiments.

FIG. 3A shows diagram **350*a*, which may be similar to diagram 250 of FIG. 2, which illustrates an enlarged area of the gate structure 202 cross section of diagram 200 of FIG. 2, and shows the metal layers 312, dielectric layers 310 and an opening 307 which may be similar to metal layers 212, dielectric layers 210 and an opening 207 of FIG. 2. Diagram 370*a*, which may be similar to diagram 270 of FIG. 2, illustrates an enlarged cross section side view which may be similar to enlarged cross section side view along A-A' of metal layers 212, dielectric layers 210, and opening 207 of transistor structure 200 of FIG. 2. Diagram 380*a* is a top-down cross-section view along B-B' between metal layers 312 that shows a dielectric layer 310 of FIG. 3A, and includes the source 304 and drain 306, which may be similar to source 204 and drain 206 of FIG. 2**.

A SAM material 309 is deposited as is shown with respect to transistor structure 350*a* of FIG. 3A. In embodiments, the SAM material 309 also penetrates the openings 307, and is deposited on at least a portion of the dielectric layers 310. In embodiments, the SAM material 309 does not penetrate all of the surface of the dielectric layers 310, but leaves a channel 311 between surfaces of the dielectric layers that does not include the SAM material 309 as shown in transistor structure 370*a*. A thickness w of the channel 311 corresponds to a thickness of the 2D channel, nanowire, or nanoribbon to be grown into the channel 311.

FIG. 3B shows transistor structure 350*b*, which may be similar to transistor structure 350*a* of FIG. 3A, of a stage in a manufacturing process where an oxygen plasma treatment is performed and the SAM material 309 of FIG. 3A has been removed. Diagram 370*b* may be similar to diagram 370*a* of FIG. 3A, and diagram 380*b* may be similar to diagram 380*a* of FIG. 3A. During the oxygen plasma treatment process, areas 317 on the dielectric 310 surface that was not covered by the SAM material 309 have been oxygenated. As a result, the areas 317 now provide a preferential growth surface for TMD during subsequent MOCVD processes.

FIG. 3C shows diagrams 350*c*, 370*c*, 380*c*, which may be similar, respectively, to diagrams 350*b*, 370*b*, 380*b* of FIG. 3B. In embodiments, a MOCVD process has been applied to deposit TMD material 308 onto the oxygenated areas 317 of FIG. 3B that are on dielectric layers 310. As a result, stacked 2D channels that may be nanowires or nanoribbons are formed with the deposited TMD material 308. In other embodiments, the SAM material 309 of FIG. 3A may be removed subsequent to the MOCVD process. In embodiments, the resulting structure may be similar to the structure shown in FIG. 1.

FIGS. 4A-4E illustrate stages in a manufacturing process for creating a transistor structure with stacked gate structures and stacked 2D TMD layers by depositing a seed and growth promoter on dielectric layers to grow TMD, in accordance with various embodiments.

Figure 4A:
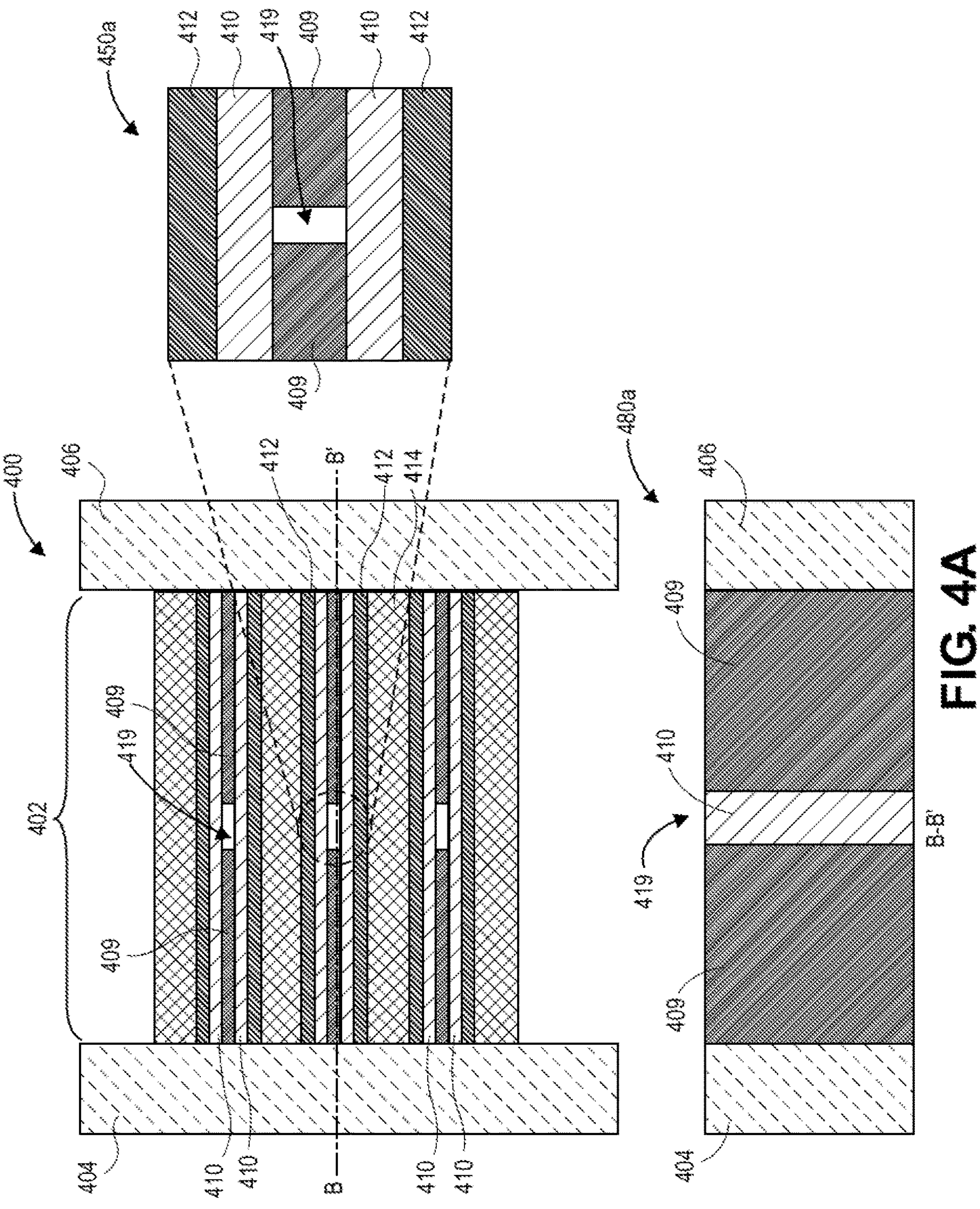
FIGS. 4A-4E illustrate stages in a manufacturing process for creating a transistor structure with stacked gate structures and stacked 2D TMD layers by depositing a seed and growth promoter on dielectric layers to grow TMD, in accordance with various embodiments.

FIG. 4A illustrates transistor structure 400, which may be similar to transistor structure 200 of FIG. 2, and shows a cross section side view that includes a stacked gate structure 402 with a source 404 at a first edge of the stacked gate structure 402 and a drain 406 and a second edge of the stacked gate structure opposite the first edge. These may be similar to stacked gate structure 202, source 204, and drain 206 of FIG. 2.

The gate structure 402 includes a layer of SAM material 409, which may be similar to SAM material 309 FIG. 3A, that is deposited between a plurality of dielectric layers 410. In embodiments, a plurality of metal layers 412 may be adjacent to the plurality of dielectric layers 410. A dielectric 414 may be adjacent to the metal layers 412. These may be similar to metal layers 212, dielectric layers 210, and dielectric 214 of FIG. 2. Diagram 450*a* illustrates an enlarged area of the gate structure 402 cross section, and shows the metal layers 412, dielectric layers 410 and SAM layer 409. Diagram 480*a* is a top-down cross-section view along B-B' between metal layers 412 that shows a dielectric layer 410.

In embodiments, a gap 419 may be formed within the layer formed by SAM material 409. In embodiments, the gap 419 may extend between surfaces of the dielectric layers 410. In embodiments, the SAM material 409 may be placed first, and the gap 419 subsequently removed using etching or some other SAM removal technique.

Figure 4C:
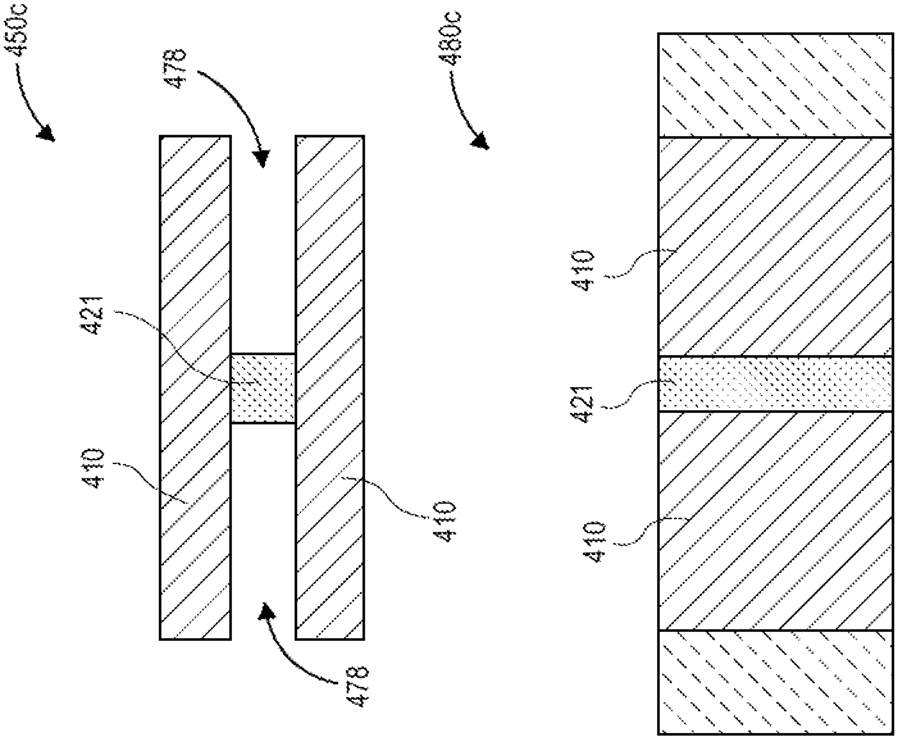
Figure 4B:
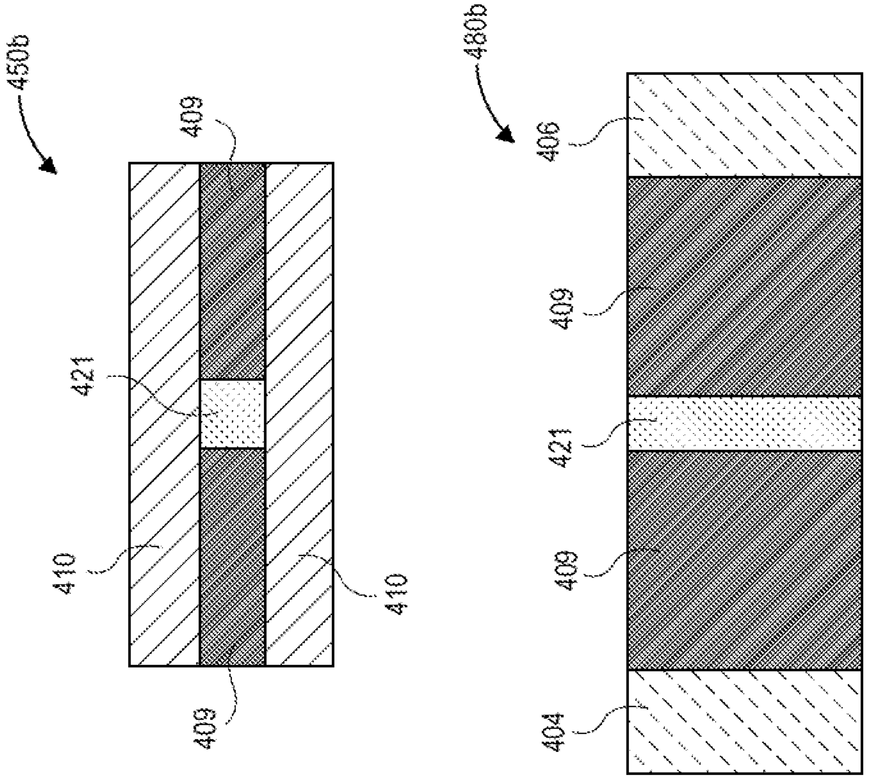

FIG. 4B illustrates a stage in the manufacturing process where a seed 421 is placed in the gap 419 of FIG. 4A. Diagrams 450*b* and 480*b*, which may be similar, respectively, to diagrams 450*a* and 480*a*, shows the seed 421 that is next to the SAM material 409. In embodiments, the seed 421 may be a metal oxide seed, such as $WO_x$ or $MoO_x$.

FIG. 4C illustrates diagrams 450*c* and 480*c*, which may be similar, respectively, to diagrams 450*b* and 480*b*, that show a stage in the manufacturing process where the SAM material 409 is removed, leaving cavities 478.

Figure 4E:
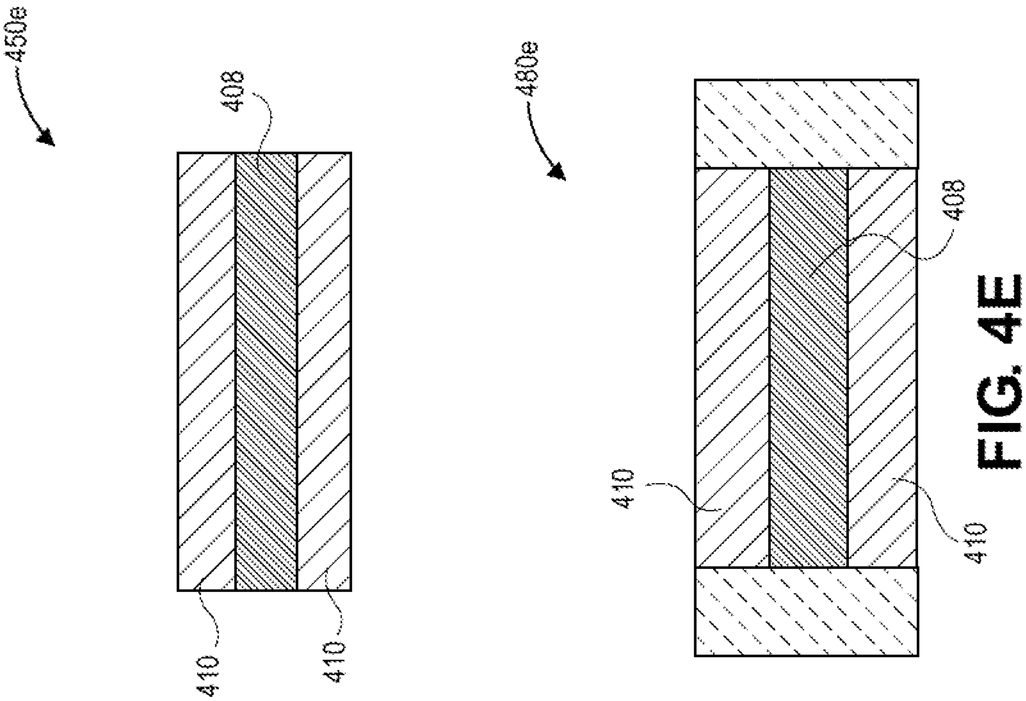
Figure 4D:
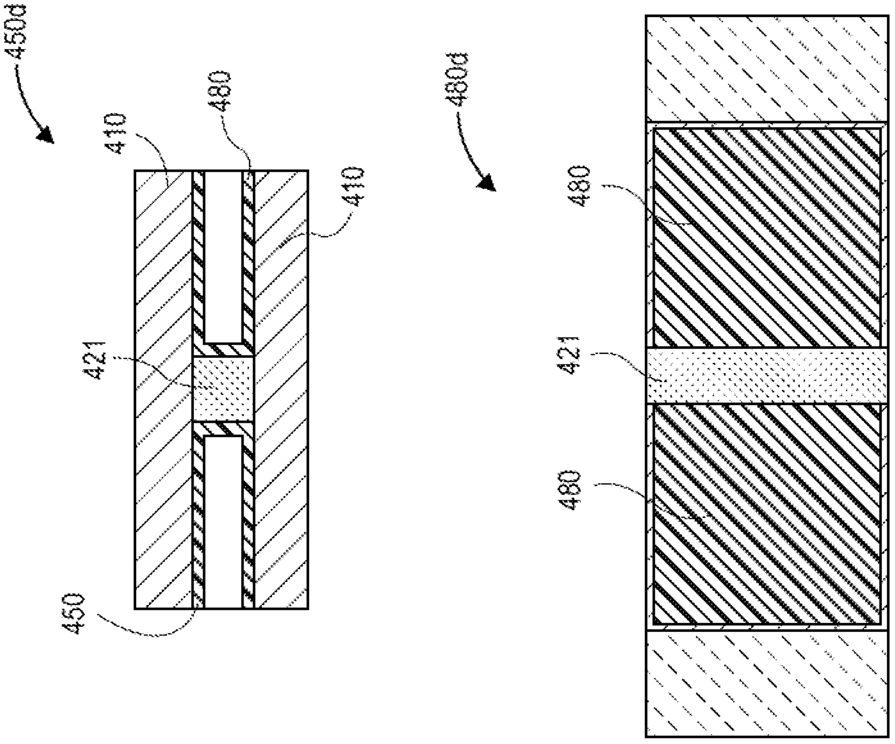

FIG. 4D illustrates diagrams 450*d* and 480*d*, which may be similar, respectively, to diagrams 450*c* and 480*c* that show a stage in the manufacturing process where a growth promoter material 480 is deposited within the cavities 478 of FIG. 4C. In embodiments, the growth promoter material 480 may include copper rings and/or sodium.

FIG. 4E illustrates diagrams 450*e* and 480*e*, which may be similar, respectively, to diagrams 450*d* and 480*d*, that show a stage in the manufacturing process where TMD 408 is grown between dielectric layers 410. In embodiments, the seed 421 and the growth promoter material 480 from FIG. 4D are used to facilitate the growth of the TMD 408. In embodiments, the resulting structure may be similar to the structure shown in FIG. 1.

As described above with respect to FIGS. 2-4E, the use of a SAM material, such as SAM material 309 of FIG. 3A, and SAM material 409 of FIGS. 4A-4B, may leave markers, or residue on services to which they are applied. In embodiments in some of these elemental markers may include the following. Fluorinated alkylsilanes (F): 1H, 1H, 2H, 2H-perfluorooctyltrichlorosilane (FOTS), (heptadecafluoro-1,1,2, 2-tetrahydrodecyl), or triethoxysilane (HDFTEOS). Alkyl Chlorosilanes (Cl): octadecyltrichlorosilane (ODTS). Phosphonates (P): octadecylphosphonic acid (OPA), octadecylphosphonic acid (ODPA). And Aminosilanes (N): bis (N,N-dimethylamino) dimethylsilane (DMADMS), (N,N-dimethylamino) trimethylsilane (DMATMS), bis (dimethylamino) dimethylsilane (BDMADMS). These elemental markers may be found on, for example, dielectric layers 310 of FIG. 3A and 410 of FIGS. 4A-4B. In addition to these elemental markers, a build-up of carbon, for example a higher concentration of carbon, due to the presence of SAM on a substrate or near a 2D TMD layer, may also be present.

Figure 5:
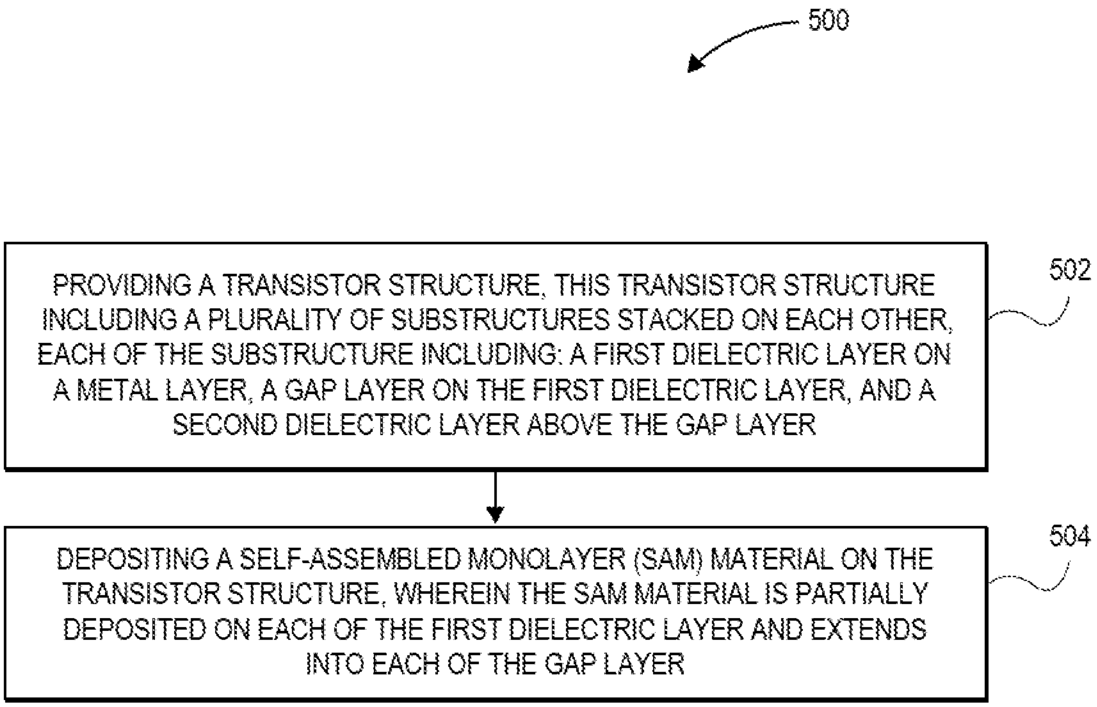
FIG. 5 illustrates an example process for manufacturing a package that includes a hermetic seal for a transistor structure that includes metal on both sides, in accordance with various embodiments. Process 500 may be implemented using the techniques and/or embodiments described herein, and in particular with respect to FIGS. 1-4E.

FIG. 5 illustrates an example process for manufacturing a package that includes a hermetic seal for a transistor structure that includes metal on both sides, in accordance with various embodiments. Process 500 may be implemented using the techniques and/or embodiments described herein, and in particular with respect to FIGS. 1-4E.

At block 502, the process may include providing a transistor structure, this transistor structure including a plurality of substructures stacked on each other, each of the substructures including: a first dielectric layer on a metal layer, a gap layer on the first dielectric layer, and a second dielectric layer above the gap layer. In embodiments, the transistor structure may be similar to transistor structure 200 of FIG. 2, the first dielectric layer and the second dielectric layer may be similar to dielectric layers 210 of FIG. 2, and a metal layer may be similar to metal layer 212 FIG. 2. In embodiments, the gap layer may be similar to openings 207 that are between the dielectric layers 210 of FIG. 2.

At block 504, the process may further include depositing a self-assembled monolayer (SAM) material on the transistor structure, wherein the SAM material is partially deposited on each of the first dielectric layer and extends into each of the gap layer. In embodiments, the SAM material may be similar to SAM material 309 of FIG. 3A, or SAM material 409 of FIGS. 4A-4B.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
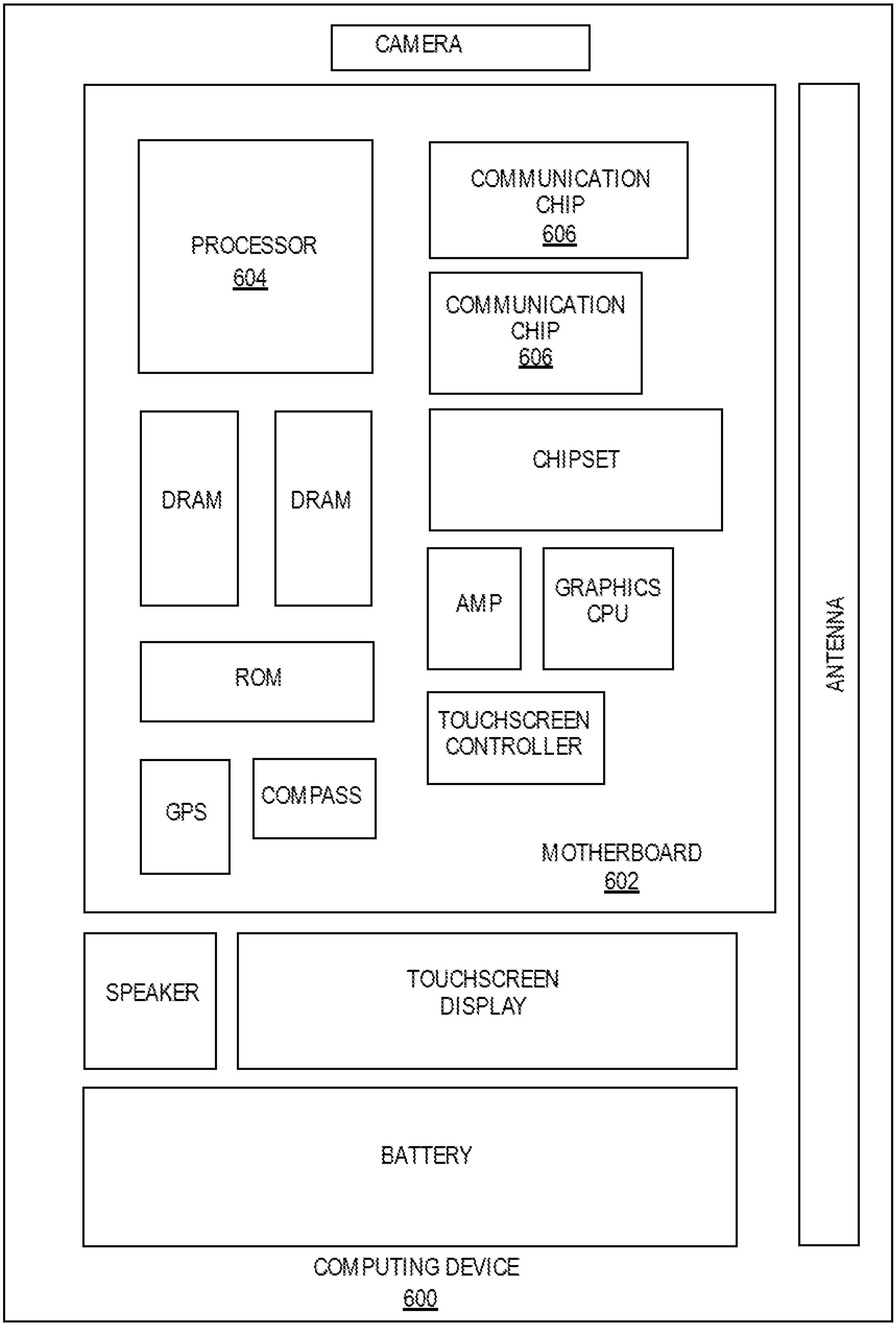
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
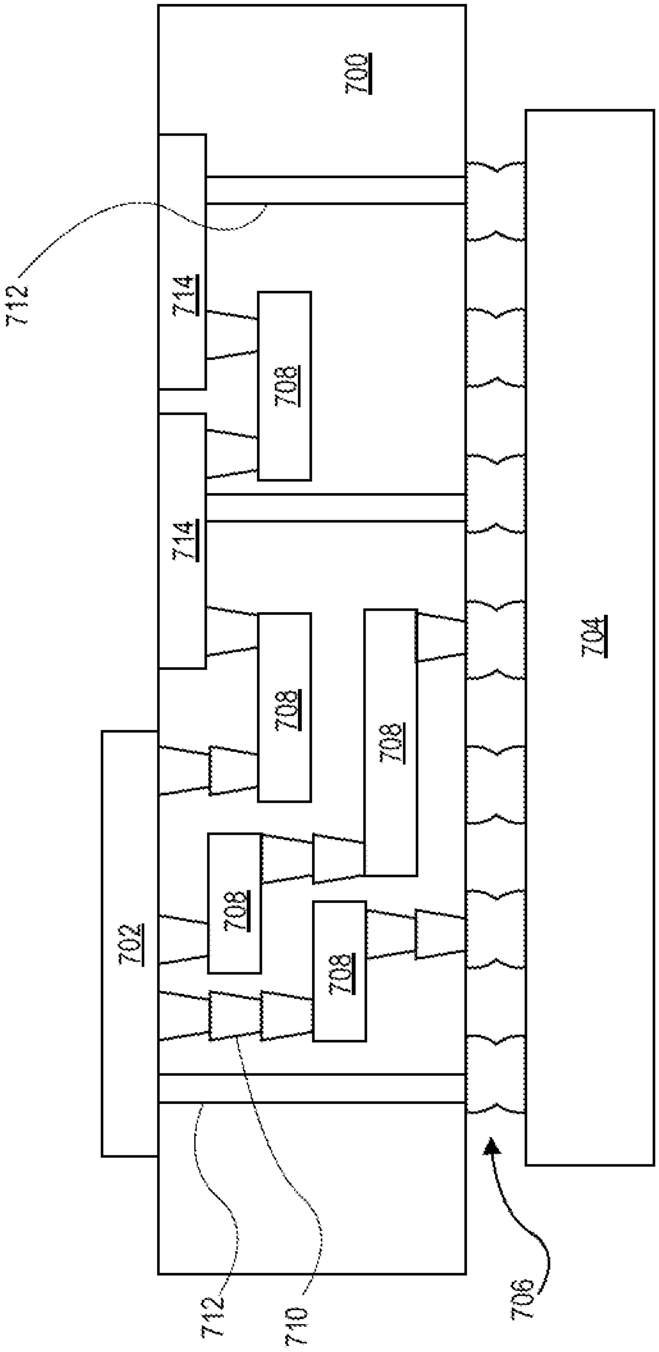
FIG. 7 illustrates an interposer that includes one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a transistor structure, comprising: a plurality of channels, wherein each of the plurality of channels is a monolayer, and wherein the plurality of channels are in a stacked formation; one or more dielectric layers, respectively, separating each of the plurality of channels; and wherein a particle proximate to a surface of one of the one or more dielectric layers adjacent to one of the plurality of channels includes a selected one or more of: fluorine, chlorine, phosphorus, or nitrogen.

Example 2 includes the transistor structure example 1, or of any other example or embodiment described herein, wherein each of the plurality of channels is a transition metal dichalcogenide (TMD) monolayer.

Example 3 includes the transistor structure of example 1, or of any other example or embodiment described herein, wherein the plurality of channels overlap each other in a direction perpendicular to a plane of one of the plurality of channels.

Example 4 includes the transistor structure example 1, or of any other example or embodiment described herein, further comprising one or more metal layers adjacent, respectively, to the one or more dielectric layers.

Example 5 includes the transistor structure example 1, or of any other example or embodiment described herein, wherein the plurality of channels are grown using a metal oxide chemical vapor deposition (MOCVD) process.

Example 6 includes the transistor structure example 1, or of any other example or embodiment described herein, wherein another particle proximate to a surface of the one of the one or more dielectric layers adjacent to the one of the plurality of channels includes oxygen.

Example 7 includes the transistor structure example 1, or of any other example or embodiment described herein, wherein a width of the each of the plurality of channels is between 5 and 50 nanometers.

Example 8 includes the transistor structure example 1, or of any other example or embodiment described herein, further comprising: a source at a first end of the plurality of channels and the one or more dielectric layers; and a drain at a second end of the plurality of channels and the one or more dielectric layers opposite the first end.

Example 9 includes the transistor structure example 1, or of any other example or embodiment described herein, further comprising a wafer; wherein one of the plurality of channels is on the wafer; and wherein the wafer includes a self-assembled monolayer (SAM) material.

Example 10 is an apparatus comprising: a wafer; and a transistor structure on the wafer, the transistor structure including: a first dielectric layer on a metal layer; a gap layer on the first dielectric layer; a second dielectric layer above the gap layer; and a self-assembled monolayer (SAM) layer on the first dielectric layer, the SAM layer extending into the gap layer.

Example 11 includes the apparatus of example 10, or of any other example or embodiment described herein, wherein the SAM layer is a first SAM layer; and further comprising: a second SAM layer on the second dielectric layer, the second SAM layer extending into the gap layer.

Example 12 includes the apparatus of example 10, or of any other example or embodiment described herein, wherein the first dielectric layer has a first area and a second area on a side of the first dielectric layer, wherein the first area and the second area are separate and distinct, wherein the first area includes the SAM layer and the second area does not include the SAM layer.

Example 13 includes the apparatus of example 12, or of any other example or embodiment described herein, wherein the second area of the first dielectric layer includes a transition metal dichalcogenide (TMD) layer.

Example 14 includes the apparatus of example 12, or of any other example or embodiment described herein, wherein the second area of the first dielectric layer includes a growth promoter.

Example 15 includes the apparatus of example 12, or of any other example or embodiment described herein, wherein the second area of the first dielectric layer includes oxygen atoms.

Example 16 includes the apparatus of example 15, or of any other example or embodiment described herein, further including a TMD layer on the second area.

Example 17 includes the apparatus of example 10, or of any other example or embodiment described herein, wherein the gap layer is a void.

Example 18 is an apparatus comprising: a wafer; and a transistor structure on the wafer, the transistor structure including: a first dielectric layer on a metal layer; a gap layer on the first dielectric layer; a second dielectric layer above the gap layer; and a seed material on the first dielectric layer, the seed material extending into the gap layer.

Example 19 includes the apparatus of example 18, or of any other example or embodiment described herein, wherein the seed material includes a selected one or more of: tungsten oxide (WOx) or molybdenum oxide (MoOx).

Example 20 includes the apparatus of example 18, or of any other example or embodiment described herein, further comprising a growth promoter on the first dielectric layer surrounding the seed material.

Example 21 includes the apparatus of example 18, or of any other example or embodiment described herein, wherein the growth promoter includes a selected one or more of: carbon or sodium.

Example 22 is a method comprising: providing a transistor structure, the transistor structure including a plurality of substructures stacked on each other, each of the substructure including: a first dielectric layer on a metal layer; a gap layer on the first dielectric layer; and a second dielectric layer above the gap layer; and depositing a self-assembled monolayer (SAM) material on the transistor structure, wherein the SAM material is partially deposited on each of the first dielectric layers and extends into each of the gap layers.

Example 23 includes the method of example 22, or of any other example or embodiment described herein, further comprising growing a transition metal dichalcogenide (TMD) on a portion of the first dielectric layers that does not have deposited SAM material.

Example 24 includes the method of example 22, or of any other example or embodiment described herein, further comprising: applying an oxygen plasma to the transistor structure; and growing a TMD on a portion of each of the first dielectric layers where the SAM material was not deposited.

Example 25 includes the method of example 22, or of any other example or embodiment described herein, further comprising: applying a seed on a portion of each of the first dielectric layers; applying a growth promoter on each of the first dielectric layers surrounding the seed; and growing a TMD on each of the first dielectric layers.

Example 26 is a die comprising: a substrate; and a transistor structure on the substrate, the transistor structure including: a first dielectric layer on a metal layer; a second dielectric layer above the first dielectric layer; wherein a side of the first dielectric layer has a first area and a second area, wherein the first area and the second area are separate and distinct, and wherein the second area includes oxygen atoms.

Example 27 includes the die of example 26, or of any other example or embodiment described herein, wherein a density of oxygen atoms on the second area of the side of the first dielectric layer is greater than a density of oxygen atoms on the first area of the side of the first dielectric layer.

Example 28 includes the die of example 26, or of any other example or embodiment described herein, further including a TMD layer on the second area of the side of the first dielectric layer.

Example 29 includes the die of example 28, or of any other example or embodiment described herein, further comprising a dielectric on the first area of the side of the first dielectric layer.

Example 30 includes the die of example 26, or of any other example or embodiment described herein, wherein a side of the second dielectric layer has a first area and a second area, wherein the first area and the second area are separate and distinct, and wherein the second area includes oxygen atoms.

Example 31 includes the die of example 30, or of any other example or embodiment described herein, wherein a density of oxygen atoms on the second area of the side of the second dielectric layer is greater than a density of oxygen atoms on the first area of the side of the second dielectric layer.

Example 32 includes the die of example 30, or of any other example or embodiment described herein, further including a TMD layer on the second area of the side of the second dielectric layer.

Example 33 includes the die of example 32, or of any other example or embodiment described herein, further comprising a dielectric on the first area of the side of the first dielectric layer.

What is claimed is:

1. A transistor structure, comprising:

a plurality of channels, wherein each of the plurality of channels is a monolayer, wherein the plurality of channels are in a stacked formation, and wherein each of the plurality of channels is a transition metal dichalcogenide (TMD) monolayer;

one or more dielectric layers, respectively, separating each of the plurality of channels; and wherein a particle proximate to a surface of one of the one or more dielectric layers adjacent to one of the plurality of channels includes a selected one or more of: fluorine or chlorine.

2. The transistor structure of claim 1, wherein the plurality of channels overlap each other in a direction perpendicular to a plane of one of the plurality of channels.

3. The transistor structure of claim 1, further comprising one or more metal layers adjacent, respectively, to the one or more dielectric layers.

4. The transistor structure of claim 1, wherein the plurality of channels are grown using a metal oxide chemical vapor deposition (MOCVD) process.

5. The transistor structure of claim 1, wherein another particle proximate to a surface of the one of the one or more dielectric layers adjacent to the one of the plurality of channels includes oxygen.

6. The transistor structure of claim 1, wherein a width of the each of the plurality of channels is between 5 and 50 nanometers.

7. The transistor structure of claim 1, further comprising:

a source at a first end of the plurality of channels and the one or more dielectric layers; and a drain at a second end of the plurality of channels and the one or more dielectric layers opposite the first end.

8. The transistor structure of claim 1, further comprising a wafer;

wherein one of the plurality of channels is on the wafer; and wherein the wafer includes a self-assembled monolayer (SAM) material.

9. A die comprising:

a substrate; and a transistor structure on the substrate, the transistor structure including:

a first dielectric layer on a metal layer;

a second dielectric layer above the first dielectric layer; and wherein a side of the first dielectric layer has a first area and a second area, wherein the first area and the second area are separate and distinct, and wherein the second area includes oxygen atoms, and wherein a density of oxygen atoms on the second area of the side of the first dielectric layer is greater than a density of oxygen atoms on the first area of the side of the first dielectric layer.

10. The die of claim 9, further including a transition metal dichalcogenide (TMD) layer on the second area of the side of the first dielectric layer.

11. The die of claim 10, further comprising a dielectric on the first area of the side of the first dielectric layer.

12. The die of claim 9, wherein a side of the second dielectric layer has a first area and a second area, wherein the first area and the second area are separate and distinct, and wherein the second area includes oxygen atoms.

13. The die of claim 12, wherein a density of oxygen atoms on the second area of the side of the second dielectric layer is greater than a density of oxygen atoms on the first area of the side of the second dielectric layer.

14. The die of claim 12, further including a TMD layer on the second area of the side of the second dielectric layer.

15. The die of claim 14, further comprising a dielectric on the first area of the side of the first dielectric layer.

16. An apparatus comprising:

a wafer; and a transistor structure on the wafer, the transistor structure including:

a first dielectric layer on a metal layer;

a gap layer on the first dielectric layer;

a second dielectric layer above the gap layer;

a seed material on the first dielectric layer, the seed material extending into the gap layer; and a growth promoter on the first dielectric layer surrounding the seed material.

17. The apparatus of claim 16, wherein the seed material includes a selected one or more of: tungsten oxide ($WO_x$) or molybdenum oxide ($MoO_x$).

18. The apparatus of claim 16, wherein the growth promoter includes a selected one or more of: carbon or sodium.

19. A method comprising:

providing a transistor structure, the transistor structure including a plurality of substructures stacked on each other, each of the substructure including:

a first dielectric layer on a metal layer;

a gap layer on the first dielectric layer; and a second dielectric layer above the gap layer; and depositing a self-assembled monolayer (SAM) material on the transistor structure, wherein the SAM material is partially deposited on each of the first dielectric layers and extends into each of the gap layers.

20. The method of claim 19, further comprising growing a transition metal dichalcogenide (TMD) on a portion of the first dielectric layers that does not have deposited SAM material.

21. The method of claim 19, further comprising:

applying an oxygen plasma to the transistor structure; and growing a TMD on a portion of each of the first dielectric layers where the SAM material was not deposited.

22. The method of claim 19, further comprising:

applying a seed on a portion of each of the first dielectric layers;

applying a growth promoter on each of the first dielectric layers surrounding the seed; and growing a TMD on each of the first dielectric layers.

23. A die comprising:

a substrate; and a transistor structure on the substrate, the transistor structure including:

a first dielectric layer on a metal layer;

a second dielectric layer above the first dielectric layer; and wherein a side of the first dielectric layer has a first area and a second area, wherein the first area and the second area are separate and distinct, and wherein the second area includes oxygen atoms, wherein a side of the second dielectric layer has a first area and a second area, wherein the first area and the second area are separate and distinct, and wherein the second area includes oxygen atoms, and wherein a density of oxygen atoms on the second area of the side of the second dielectric layer is greater than a density of oxygen atoms on the first area of the side of the second dielectric layer.

* * * * *